United States Patent
Kim et al.

(10) Patent No.: US 11,567,141 B2
(45) Date of Patent: Jan. 31, 2023

(54) APPARATUS AND METHOD FOR DETECTING FAULTY BATTERY CELL

(71) Applicant: LG CHEM, LTD., Seoul (KR)

(72) Inventors: An Soo Kim, Daejeon (KR); Dong Keun Kwon, Daejeon (KR); Hyun Chul Lee, Daejeon (KR); Sung Yul Yoon, Daejeon (KR); Seung Hyun Kim, Daejeon (KR); Jae Sung Im, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 316 days.

(21) Appl. No.: 16/906,186

(22) Filed: Jun. 19, 2020

(65) Prior Publication Data
US 2020/0408849 A1 Dec. 31, 2020

(30) Foreign Application Priority Data
Jun. 28, 2019 (KR) .......................... 10-2019-0078225

(51) Int. Cl.
| G01R 31/00 | (2006.01) |
| G01R 31/396 | (2019.01) |
| H01M 10/48 | (2006.01) |
| G01R 31/36 | (2020.01) |
| H01M 10/42 | (2006.01) |
| G01R 31/388 | (2019.01) |

(52) U.S. Cl.
CPC ....... *G01R 31/396* (2019.01); *G01R 31/3648* (2013.01); *G01R 31/388* (2019.01); *H01M 10/4257* (2013.01); *H01M 10/482* (2013.01); *H01M 2010/4271* (2013.01); *H01M 2010/4278* (2013.01)

(58) Field of Classification Search
USPC .......................................... 324/426, 433–435
See application file for complete search history.

(56) References Cited

U.S. PATENT DOCUMENTS

| 9,573,472 | B2 | 2/2017 | Takada et al. |
| 2016/0276846 | A1 | 9/2016 | Kuroda et al. |
| 2016/0336623 | A1* | 11/2016 | Nayar .................. H01M 10/39 |
| 2018/0090948 | A1 | 3/2018 | Park |
| 2018/0183252 | A1 | 6/2018 | Kim et al. |
| 2019/0044194 | A1 | 2/2019 | Hong et al. |
| 2019/0025382 | A1 | 6/2019 | Yamada |
| 2020/0331359 | A1* | 10/2020 | Otjens ................. G01R 31/392 |

FOREIGN PATENT DOCUMENTS

| JP | 6174154 B2 | 8/2017 |
| JP | 2017-181484 A | 10/2017 |
| KR | 10-2018-0044483 A | 5/2018 |
| KR | 10-2018-0074301 A | 7/2018 |
| KR | 10-1898006 B1 | 9/2018 |
| KR | 10-1940704 B1 | 1/2019 |

* cited by examiner

*Primary Examiner* — Vincent Q Nguyen
(74) *Attorney, Agent, or Firm* — Birch, Stewart, Kolasch & Birch, LLP

(57) ABSTRACT

A battery pack according to an embodiment of the present disclosure may include a plurality of battery cells and a BMS for controlling the battery pack. The BMS may include a state-of-charge (SOC) calculation module for calculating a SOC of each of the plurality of battery cells included in the battery pack and a faulty battery cell detection unit for detecting at least one faulty battery cell on the basis of the calculated SOC of each of the plurality of battery cells.

8 Claims, 2 Drawing Sheets

APPARATUS AND METHOD FOR DETECTING FAULTY BATTERY CELL

CROSS-REFERENCE TO RELATED APPLICATION

This application claims priority to Korean Patent Application No. 10-2019-0078225 filed on Jun. 28, 2019 and all the benefits accruing therefrom under 35 U.S.C. § 119, the contents of which are incorporated by reference in their entirety.

BACKGROUND

The present disclosure relates to an apparatus and method for detecting a low-voltage battery cell among a plurality of battery cells included in a battery pack.

A battery pack is an assembly including a plurality of components and obtained by assembling a module by welding and containing single battery cells in a housing and then connecting the module through a bus bar and wire. A fault of a battery cell may frequently occur in such a battery pack.

If a fault occurs in any one of battery cells included in a battery pack, a significant change in internal resistance (IR) of the battery cell occurs when the battery cell is charged or discharged.

That is, a higher voltage than that of a normal battery cell is generated in a charged state, and a lower voltage than that of a normal battery cell is generated in a discharged state.

If a charging or discharging operation is repeatedly performed even when a low-voltage fault occurs in a battery cell, the total output of a battery pack may decrease.

In particular, in the case of an ESS in which a plurality of battery packs are connected, when any one battery cell is faulty as described above, and thus the output of a battery pack including the faulty battery cell decreases, the ESS may not be efficiently used due to a difference from other battery packs of the ESS.

Furthermore, when the low-voltage fault battery cell is continuously charged or discharged, the low-voltage fault battery cell may be short-circuited, causing a fire or safety problem.

According to the related art, in order to detect such a faulty battery cell, a cell balancing operation is performed, and the number of times a battery cell having a low voltage is detected is counted.

However, according to the related art, since the cell balancing operation is required to be performed, it may take a long time to detect a faulty battery cell, and a faulty battery cell may cause a problem even while the cell balancing operation is performed.

Therefore, the present disclosure provides an apparatus and method for detecting a faulty battery cell without performing a battery balancing operation.

PRIOR ART DOCUMENT

[Patent Document]
Korean Patent Registration No. 1898006 B1

SUMMARY

The present disclosure provides an apparatus and method for detecting a faulty battery cell among a plurality of battery cells included in a battery pack.

In detail, the present disclosure provides an apparatus and method for detecting a faulty battery cell quickly and safely without performing a battery cell balancing operation.

In accordance with an exemplary embodiment, a battery pack includes a plurality of battery cells and a BMS configured to control the battery pack, the BMS including a state-of-charge (SOC) calculation module configured to calculate a SOC of each of the plurality of battery cells included in the battery pack and a faulty battery cell detection unit configured to detect at least one faulty battery cell among the plurality of battery cells on the basis of the calculated SOC of each of the plurality of battery cells.

The faulty battery cell detection unit may include: a SOC average value calculation module configured to calculate an average value of the calculated SOCs of the plurality of battery cells; a maximum/minimum SOC value detection module configured to detect a minimum SOC value and a maximum SOC value among the calculated SOCs of the plurality of battery cells; an error verification module configured to confirm whether the detected minimum SOC value and the detected maximum SOC value fall within a predetermined error range relative to the calculated SOC average value; and a minimum/maximum SOC battery cell detection module configured to detect a first battery cell among the plurality of battery cells having the minimum SOC value when the minimum SOC value of the first battery cell is outside the predetermined error range relative to the average value as a result of error verification by the error verification module, and to detect a second battery cell having the maximum SOC value among the plurality of battery cells when the maximum SOC value of the second battery cell is outside the predetermined error range relative to the average value as a result of error verification by the error verification module.

The SOC calculation module may repeatedly calculate the SOC of each of the plurality of battery cells a predetermined rest time after finishing charging or discharging of the battery pack.

The faulty battery cell detection unit may further include a counting module configured to count a number of detections with regard to the first battery cell and a number of detections with regard to the second battery cell.

When the first battery cell is counted by the counting module as having the minimum SOC value at least a predetermined number of times, the faulty battery cell detection unit determines, as the at least one faulty battery cell, the first battery cell, or wherein when the second battery cell is counted by the counting module having the maximum SOC value at least the predetermined number of times, the faulty battery cell detection unit determines, as the at least one faulty battery cell, the second battery cell.

The battery pack may further include a notification unit configured to externally transmit a notification signal when there is a battery cell among the plurality of battery cells detected by the faulty battery cell detection unit as the at least one faulty battery cell.

In accordance with another exemplary embodiment, a method for detecting a faulty battery cell in a battery pack including a plurality of battery cells includes: calculating, by a BMS, a state of charge (SOC) of each of the plurality of battery cells; and detecting at least one faulty battery cell among the plurality of battery cells on the basis of the SOC of each of the plurality of battery cells calculated by the BMS.

The calculating of the SOC may include calculating the SOC of each of the plurality of battery cells a predetermined time after finishing charging or discharging of the battery pack.

The detecting of the faulty battery cell may include: calculating an average value of the calculated SOCs of the plurality of battery cells; detecting a minimum SOC value and a maximum SOC value among the calculated SOCs of the plurality of battery cells; confirming whether the detected minimum SOC value and maximum SOC value fall within a predetermined error range relative to the calculated SOC average value; detecting a first battery cell having the minimum SOC value when the minimum SOC value of the first battery cell is outside the predetermined error range relative to the average value as a result of the confirming, and detecting a second battery cell having the maximum SOC value when the maximum SOC value of the second battery cell is outside the predetermined error range relative to the average value as a result of the confirming; and counting a number of detections with regard to the first battery cell and a number of detections with regard to the second battery cell.

During the detecting of the at least one faulty battery cell, and after repeatedly performing the calculating of the SOC, the calculating of the average value, the detecting of the minimum SOC value and the maximum SOC value, the confirming, the detecting of the first battery cell having the minimum SOC value and the second battery cell having the maximum SOC value, and the counting of the number of detections of the first battery cell and the number of detections of the second battery cell at predetermined time intervals, when the first battery cell is detected as having the minimum SOC value at least a predetermined number of times, determining, as the at least one faulty battery cell, the first battery cell, or when the second battery cell is detected as having the maximum SOC at least a predetermined number of times, determining, as the at least one faulty battery cell, the second battery cell.

During the detecting of the at least one faulty battery cell, the BMS may determine that all of the battery cells included in the battery pack are in a normal state when there is no battery cell detected as having the minimum SOC value at least a predetermined number of times or detected as having the maximum SOC value at least the predetermined number of times as a result of the counting of the number of detections.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
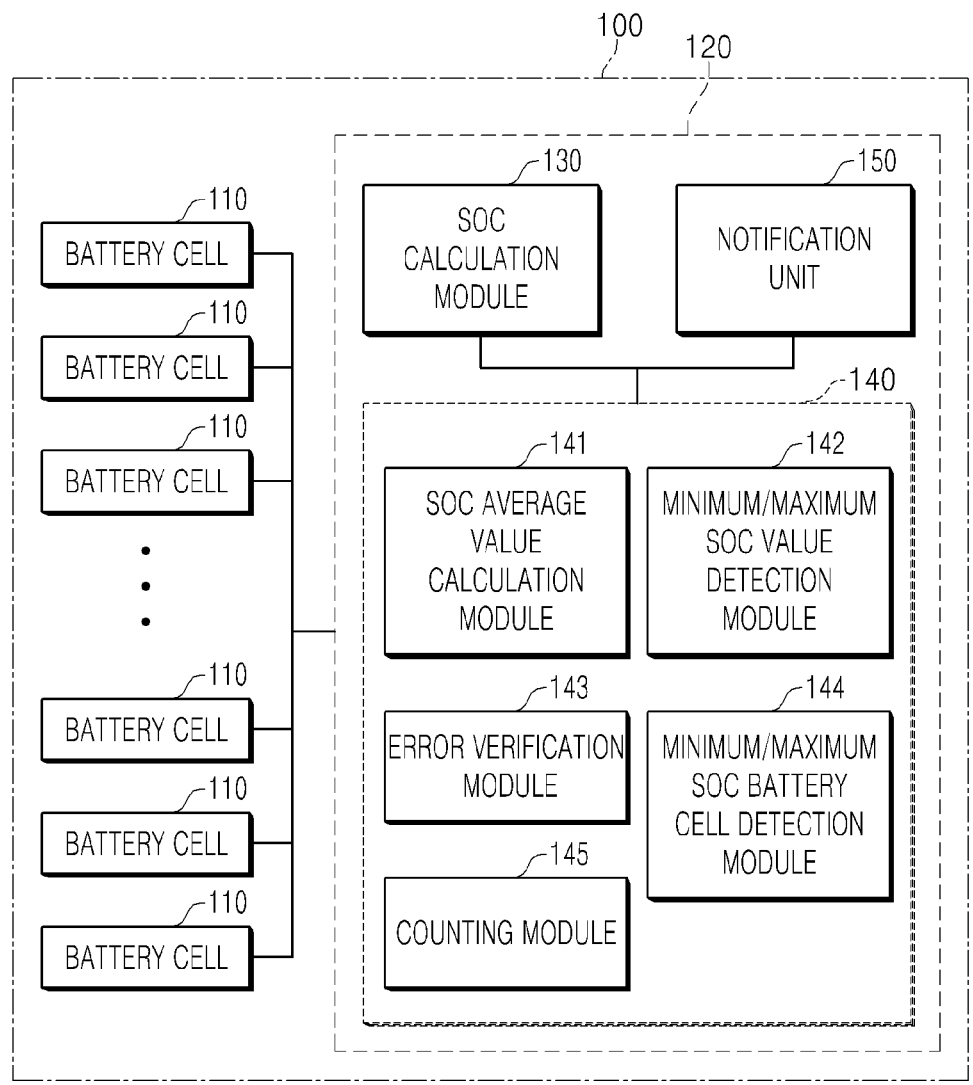
FIG. 1 is a diagram illustrating a battery pack according to an embodiment of the present disclosure.

Hereinafter, embodiments of the present disclosure will be described in detail with reference to the accompanying drawings so that those of ordinary skill in the art can easily carry out the present invention. However, the present invention may be implemented in various different forms and is not limited to the embodiments described herein. Some parts of the embodiments, which are not related to the description, are not illustrated in the drawings in order to clearly describe the embodiments of the present disclosure. Like reference numerals refer to like elements throughout the description.

The term "first", "second" or the like may be used for describing various elements but does not limit the elements. Such terms are only used for distinguishing one element from other elements. For example, without departing the scope of the present invention, a first element may be referred to as a second element, and likewise, a second element may be referred to as a first element. The terminology used herein is not for delimiting the present invention but for describing specific embodiments. The terms of a singular form may include plural forms unless otherwise specified.

In the entire description, when one part is referred to as being "connected" to another part, the former may be "directly connected" to the latter or "electrically connected" thereto via an intervening other part. When it is mentioned that a certain part "includes" or "comprises" certain elements, the part may further include other elements, unless otherwise specified. The term "step (ing) . . ." or "step of . . ." used herein does not represent "step for . . .".

The terms used herein have been selected from among general terms that are widely used at the present time in consideration of the functions of the present invention, but may be changed depending on intentions of those skilled in the art, judicial precedents, or the advent of new technology. Furthermore, specific terms have been arbitrarily selected by the applicant, and the meanings of such terms will be described in detail in relevant sections of the description. Therefore, it should be understood that the terms used herein should not be simply defined literally but should be defined on the basis of the meanings of the terms and the overall contents of the present disclosure.

1. Battery Pack According to an Embodiment of the Present Disclosure

A battery pack according to an embodiment of the present disclosure may detect a faulty battery cell among a plurality of battery cells included in the battery pack.

In detail, according to the present disclosure, a faulty battery cell may be detected at an early stage from a calculated state of charge of each of a plurality of battery cells after resting for a predetermined time after finishing charging or discharging of a battery pack without performing a cell balancing operation.

According to a conventional method for detecting a faulty cell (low-voltage cell), a low-voltage cell is detected after equalizing voltages of battery cells by performing a cell balancing operation. Thus, a faulty cell may not be detected due to a small voltage difference from a normal cell, or may be detected late after the fault becomes serious. In this case, a safety accident such as a fire or explosion of a battery pack may occur.

Furthermore, according to a conventional method for detecting a faulty cell, it may take a long time to detect a faulty cell since the faulty cell is detected after performing a cell balancing operation.

Thus, according to the present disclosure, in order to resolve above issues, a faulty battery cell is detected without performing a cell balancing operation, and thus a required time for detecting a faulty battery cell may reduce. Furthermore, since a faulty battery cell may be detected at an early stage, a safety accident such as a fire or explosion of a battery pack, which may occur due to continuous use of the faulty battery cell, may be prevented.

FIG. 1 is a diagram illustrating a configuration of a battery pack according to an embodiment of the present disclosure.

Hereinafter, the battery pack according to an embodiment of the present disclosure will be described with reference to FIG. 1.

A battery pack 100 includes a plurality of battery cells 110 and a BMS 120 which controls the battery pack. The BMS 120 includes a state-of-charge (SOC) calculation module 130, which calculates a SOC of each of the plurality of battery cells included in the battery pack, and a faulty battery cell detection unit 140, which detects a faulty battery cell on the basis of the calculated SOC of each of the plurality of battery cells.

In detail, the faulty battery cell detection unit 140 includes a SOC average value calculation module 141, which calculates an average value of the calculated SOCs of the plurality of battery cells, a maximum/minimum SOC value detection module 142, which detects a minimum SOC value and a maximum SOC value among the calculated SOCs of the plurality of battery cells, an error verification module 143, which confirms whether the detected minimum SOC value and maximum SOC value fall within a predetermined error range relative to the calculated SOC average value, and a minimum/maximum SOC battery cell detection module 144, which detects a battery cell having the minimum SOC value when the minimum SOC value is outside the predetermined error range relative to the SOC average value as a result of error verification by the error verification module, and which detects a battery cell having the maximum SOC value when the maximum SOC value is outside the predetermined error range relative to the SOC average value.

The error verification module 143 may prevent a normal battery cell from being erroneously determined to be a faulty battery cell due to an error that may occur during a process of calculating the SOC of a battery cell. In detail, slight voltage and current differences may be present even between normal battery cells after elapse of a predetermined time after finishing charging or discharging of the battery cells, and an error may also occur in a measurement device for measuring a voltage and current of the battery cells.

For example, when an average SOC of battery cells is 10, but the maximum SOC value is 10.1, this difference falls within a range of error that may occur due to the measurement device or slight voltage and current differences between the battery cells. Thus, it may be desirable to determine that the battery cells are in a normal state although the battery cells have an SOC that is greater than the average SOC.

Therefore, the error verification module may be used to prevent a normal battery cell from being erroneously determined to be a faulty battery cell.

Meanwhile, the faulty battery cell detection unit 140 may further include a counting module 145, which counts the number of detections with regard to a battery cell detected as a battery cell having the minimum SOC value and a battery cell detected as a battery cell having the maximum SOC value.

When there is a battery cell detected and counted by the counting module 145 as a battery cell having the minimum SOC value at least a predetermined number of times or there is a battery cell detected and counted by the counting module 145 as a battery cell having the maximum SOC value at least the predetermined number of times, the faulty battery cell detection unit 140 determines, as faulty battery cells, the battery cell detected as a battery cell having the minimum SOC value at least the predetermined number of times and the battery cell detected as a battery cell having the maximum SOC value at least the predetermined number of times. This determination is based on the fact that when the SOC of a faulty battery cell is calculated after elapse of a rest time after finishing charging or discharging of the faulty battery cell, the calculated SOC is significantly higher or lower than that of a normal battery cell (average SOC). Therefore, it is highly likely that a battery cell repeatedly detected as a battery cell having the maximum SOC value or the minimum SOC value is a faulty battery cell.

Meanwhile, the battery pack according to an embodiment of the present disclosure may further include a notification unit 150, which externally transmits a notification signal when there is a battery cell detected by the faulty battery cell detection unit as a faulty battery cell.

Meanwhile, when there is a battery cell detected by the faulty battery cell detection unit as a faulty battery cell, the battery pack according to an embodiment of the present disclosure may electrically separate only the faulty battery cell or may electrically separate an entire battery module (battery pack) including the faulty battery cell to prevent a safety accident such as a fire or explosion of a battery pack.

Figure 2:
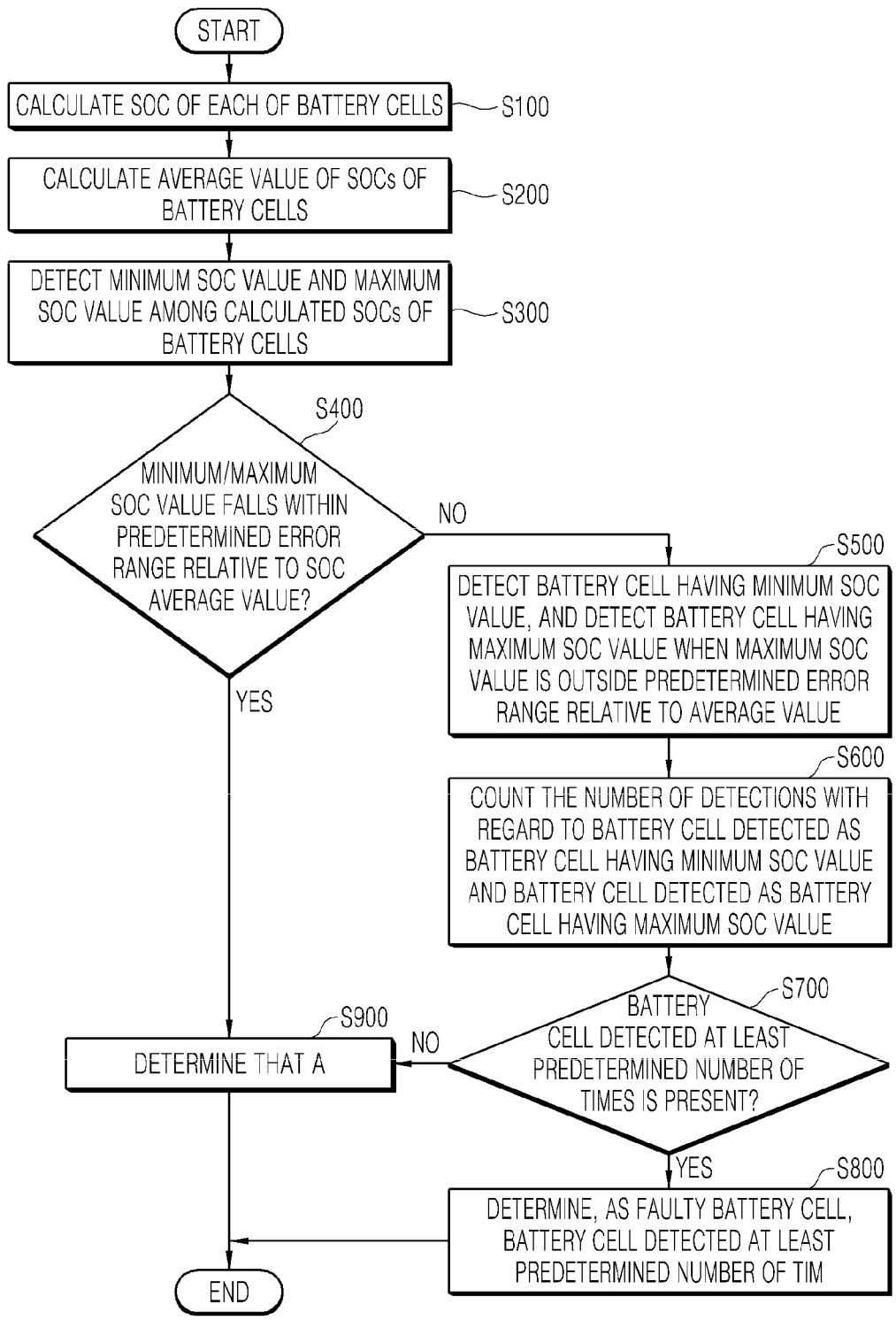
FIG. 2 is a flowchart illustrating a method for detecting a faulty battery cell according to an embodiment of the present disclosure.

2. Method for Detecting a Faulty Battery Cell According to an Embodiment of the Present Disclosure FIG. 2 is a flowchart illustrating a method for detecting a faulty battery cell according to an embodiment of the present disclosure.

Hereinafter, the method for detecting a faulty battery cell according to an embodiment of the present disclosure will be described with reference to FIG. 2.

The method for detecting a faulty battery cell according to an embodiment of the present disclosure may include calculating, by a BMS, a SOC of each of a plurality of battery cells (S100) and detecting a faulty battery cell on the basis of the SOC of each of the plurality of battery cells calculated by the BMS (S200 to S900).

In detail, during the calculating of the SOC (S100), the SOC of each of the battery cells is calculated after elapse of a predetermined rest time after finishing charging or discharging of a battery pack.

Meanwhile, the detecting of the faulty battery cell includes calculating an average value of the calculated SOCs of the plurality of battery cells (S200), detecting a minimum SOC value and a maximum SOC value among the calculated SOCs of the plurality of battery cells (S300), confirming whether the detected minimum SOC value and maximum SOC value fall within a predetermined error range relative to the calculated SOC average value (S400), detecting a battery cell having the minimum SOC value when the minimum SOC value is outside the predetermined error range relative to the average value as a result of the confirming, and detecting a battery cell having the maximum SOC value when the maximum SOC value is outside the predetermined error range relative to the average value (S500), and counting the number of detections with regard to the battery cell detected as the battery cell having the minimum SOC value and the battery cell detected as the battery cell having the maximum SOC value (S600).

Meanwhile, during the detecting of the faulty battery cell, after repeatedly performing the calculating of the SOC (S100), the calculating of the average value (S200), the detecting of the minimum SOC value and the maximum SOC value (S300), the confirming (S400), the detecting of the battery cell having the minimum SOC value and the battery cell having the maximum SOC value (S500), and the counting of the number of detections (S600) at predetermined time intervals, when there is a battery cell detected as the battery cell having the minimum SOC value at least a predetermined number of times or detected as the battery cell having the maximum SOC value at least the predetermined number of times (S700) as a result of the detecting of the number of detections (S600), the detected battery cell is determined to be the faulty battery cell (S800).

Meanwhile, during the counting of the number of detections, when there is no battery cell detected as the battery cell having the minimum SOC value at least the predetermined number of times or detected as the battery cell having the maximum SOC value at least the predetermined number of times, the BMS determines that all of the battery cells included in the battery pack are in a normal state (S900).

Meanwhile, when there is a battery cell determined to be the faulty battery cell, presence of the faulty battery cell may be notified to a user through a notification.

Furthermore, only the battery cell determined to be the faulty battery cell may be electrically separated, or an entire battery module (battery pack) including the faulty battery cell may be electrically separated.

Although the technical concept of the present invention has been specifically described according to the above-mentioned embodiment, it should be noted that the above-mentioned embodiment is not for limiting the present invention but for describing the present invention. Furthermore, those skilled in the art could understand that various embodiments can be made within the scope of the technical concept of the present invention.

An apparatus for detecting a faulty battery cell according to the present disclosure may detect a faulty battery cell among battery cells included in a battery pack at an early stage.

In detail, according to the present disclosure, the time required for detecting a faulty battery cell may be reduced by detecting a faulty battery cell without performing a cell balancing operation.

Furthermore, according to the present disclosure, a safety accident such as a fire or explosion of a faulty battery cell, which may occur during a cell balancing operation, may be prevented by detecting a faulty battery cell without performing the cell balancing operation.

Furthermore, according to the present disclosure, a faulty battery cell may be detected at an early stage so as to prevent an output of a battery pack from being decreased due to the faulty battery cell.

Furthermore, according to the present disclosure, a faulty battery cell may be detected at an early stage so as to prevent a situation in which an output of a battery pack including a faulty battery cell, among battery packs included in an ESS, is decreased, and the ESS is not efficiently used.

Although the technical concept of the present invention has been specifically described according to the above-mentioned embodiments, it should be noted that the above-mentioned embodiments are not for limiting the present invention but for describing the present invention. Furthermore, those skilled in the art could understand that various embodiments can be made within the scope of the technical concept of the present invention.

What is claimed is:

1. A battery pack, comprising:
a plurality of battery cells; and
a BMS configured to control the battery pack, the BMS including:
a state-of-charge (SOC) calculation module configured to calculate a SOC of each of the plurality of battery cells included in the battery pack; and
a faulty battery cell detection unit configured to detect at least one faulty battery cell among the plurality of battery cells on the basis of the calculated SOC of each of the plurality of battery cells, wherein the SOC calculation module repeatedly calculates the SOC of each of the plurality of battery cells a predetermined rest time after finishing charging or discharging of the battery pack, and
wherein the faulty battery cell detection unit further comprises a counting module configured to count a number of detections with regard to a first battery cell having a minimum SOC value and a number of detections with regard to a second battery cell having a maximum SOC value.

2. The battery pack of claim 1, wherein the faulty battery cell detection unit comprises:
a SOC average value calculation module configured to calculate an average value of the calculated SOCs of the plurality of battery cells;
a maximum/minimum SOC value detection module configured to detect the minimum SOC value and the maximum SOC value among the calculated SOCs of the plurality of battery cells;
an error verification module configured to confirm whether the detected minimum SOC value and the detected maximum SOC value fall within a predetermined error range relative to the calculated SOC average value; and
a minimum/maximum SOC battery cell detection module configured to detect the first battery cell among the plurality of battery cells having the minimum SOC value when the minimum SOC value of the first battery cell is outside the predetermined error range relative to the average value as a result of error verification by the error verification module, and to detect detect the second battery cell among the plurality of battery cells having the maximum SOC value when the maximum SOC value of the second battery cell is outside the predetermined error range relative to the average value as a result of error verification by the error verification module.

3. The battery pack of claim 1, wherein, when the first battery cell is counted by the counting module as having the minimum SOC value at least a predetermined number of times, the faulty battery cell detection unit determines, as the at least one faulty battery cell, the first battery cell, or
wherein when the second battery cell is counted by the counting module as having the maximum SOC value at least the predetermined number of times, the faulty battery cell detection unit determines, as the at least one faulty battery cell, the second battery cell.

4. The battery pack of claim 1, wherein the battery pack further comprises a notification unit configured to externally transmit a notification signal when there is a battery cell among the plurality of battery cells detected by the faulty battery cell detection unit as the at least one faulty battery cell.

5. A method for detecting a faulty battery cell in a battery pack comprising a plurality of battery cells, the method comprising:
calculating, by a BMS, a state of charge (SOC) of each of the plurality of battery cells; and
detecting at least one faulty battery cell among the plurality of battery cells on the basis of the SOC of each of the plurality of battery cells calculated by the BMS,
wherein the BMS repeatedly calculates the SOC of each of the plurality of battery cells a predetermined rest time after finishing charging or discharging of the battery pack, and
wherein the method further comprises counting a number of detections with regard to a first battery cell having a minimum SOC value and a number of detections with regard to a second battery cell having a maximum SOC value.

6. The method of claim 5, wherein the detecting of the faulty battery cell comprises:
calculating an average value of the calculated SOCs of the plurality of battery cells;
detecting the minimum SOC value and the maximum SOC value among the calculated SOCs of the plurality of battery cells;
confirming whether the detected minimum SOC value and maximum SOC value fall within a predetermined error range relative to the calculated SOC average value;
detecting the first battery cell having the minimum SOC value when the minimum SOC value of the first battery cell is outside the predetermined error range relative to the average value as a result of the confirming, and detecting the second battery cell having the maximum SOC value when the maximum SOC value of the second battery cell is outside the predetermined error range relative to the average value as a result of the confirming; and
counting a number of detections with regard to the first battery cell and a number of detections with regard to the second battery cell.

7. The method of claim 6, wherein, during the detecting of the at least one faulty battery cell, and after repeatedly performing the calculating of the SOC, the calculating of the average value, the detecting of the minimum SOC value and the maximum SOC value, the confirming, the detecting of the first battery cell having the minimum SOC value and the second battery cell having the maximum SOC value, and the counting of the number of detections of the first battery cell and the number of detections of the second battery cell at predetermined time intervals, when the first battery cell is detected as having the minimum SOC value at least a predetermined number of times, determining, as the at least one faulty battery cell, the first battery cell, or when the second battery cell is detected as having the maximum SOC at least a predetermined number of times, determining, as the at least one faulty battery cell, the second battery cell.

8. The method of claim 6, wherein during the detecting of the at least one faulty battery cell, the BMS determines that all of the battery cells included in the battery pack are in a normal state when there is no battery cell detected as having the minimum SOC value at least a predetermined number of times or detected as having the maximum SOC value at least the predetermined number of times as a result of the counting of the number of detections.

* * * * *